United States Patent
Jang et al.

(10) Patent No.: US 10,196,273 B2
(45) Date of Patent: Feb. 5, 2019

(54) DEVICE FOR MANUFACTURING POLYSILICON USING HORIZONTAL REACTOR AND METHOD FOR MANUFACTURING SAME

(71) Applicant: LG CHEM, LTD., Seoul (KR)

(72) Inventors: Eunsu Jang, Daejeon (KR); Jeong Kyu Kim, Daejeon (KR); Yoo Seok Kim, Daejeon (KR); JinHyoung Yoo, Daejeon (KR); JungWoo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/310,716

(22) PCT Filed: May 11, 2015

(86) PCT No.: PCT/KR2015/004701
§ 371 (c)(1),
(2) Date: Nov. 11, 2016

(87) PCT Pub. No.: WO2015/174705
PCT Pub. Date: Nov. 19, 2015

(65) Prior Publication Data
US 2017/0073234 A1    Mar. 16, 2017

(30) Foreign Application Priority Data
May 13, 2014 (KR) .......................... 10-2014-0057094

(51) Int. Cl.
*C01B 33/029* (2006.01)
*B01J 19/00* (2006.01)
(Continued)

(52) U.S. Cl.
CPC ........... *C01B 33/029* (2013.01); *B01J 12/005* (2013.01); *B01J 12/02* (2013.01); *B01J 19/00* (2013.01);
(Continued)

(58) Field of Classification Search
CPC .... C01B 33/029; C01B 33/035; B01J 12/005; B01J 12/02; B01J 19/00; B01J 19/2415;
(Continued)

(56) References Cited

U.S. PATENT DOCUMENTS

| 4,188,368 A | 2/1980 | Wolf et al. |
| 5,504,166 A | 4/1996 | Buchelli et al. |

(Continued)

FOREIGN PATENT DOCUMENTS

| CN | 1699161 A | 11/2005 |
| CN | 100347083 C | 11/2007 |

(Continued)

OTHER PUBLICATIONS

AIISHIL International, (2014), www.aiishil.com/heat-exchanger.html.*
(Continued)

*Primary Examiner* — James A Fiorito
(74) *Attorney, Agent, or Firm* — Dentons US LLP

(57) ABSTRACT

The present invention relates to a polysilicon production apparatus. The apparatus includes: a horizontal reaction tube positioned in an insulated tube and having an inlet port through which gaseous raw materials including silicon-containing reactant gases and a reducing gas are supplied, an outlet port through which residual gases exit, a reaction surface with which the gaseous raw materials come into contact, and a plurality of bottom openings through which molten polysilicon produced by the reactions of the gaseous raw materials is discharged; one or more internal structures
(Continued)

placed in the horizontal reaction tube to provide additional reaction surfaces; and first heating means adapted to heat the reaction surface of the horizontal reaction tube. The present invention also relates to a method for the production of polysilicon using the apparatus.

16 Claims, 6 Drawing Sheets

(51) Int. Cl.
    *C01B 33/035*    (2006.01)
    *C30B 29/06*    (2006.01)
    *B01J 12/00*    (2006.01)
    *B01J 12/02*    (2006.01)
    *B01J 19/24*    (2006.01)

(52) U.S. Cl.
    CPC ......... *B01J 19/2415* (2013.01); *C01B 33/035* (2013.01); *C30B 29/06* (2013.01); *B01J 2219/182* (2013.01)

(58) Field of Classification Search
    CPC ........ B01J 2219/182; B01J 2219/00135; B01J 2219/11132; C30B 29/06
    See application file for complete search history.

(56) References Cited

U.S. PATENT DOCUMENTS

| | | |
|---|---|---|
| 6,861,144 B2 | 3/2005 | Wakamatsu et al. |
| 7,264,782 B2 | 9/2007 | Nougier et al. |
| 7,553,467 B2 | 6/2009 | Wakamatsu et al. |
| 7,993,455 B2 | 8/2011 | Nakashima et al. |
| 2010/0252413 A1 | 10/2010 | Park |
| 2010/0303692 A1 | 12/2010 | Perkins et al. |
| 2015/0114318 A1* | 4/2015 | Zhang .................. F22B 1/18 122/1 C |

FOREIGN PATENT DOCUMENTS

| | | |
|---|---|---|
| CN | 201834767 U | 5/2011 |
| GB | 1210911 A | 11/1970 |
| JP | 2008-037735 A | 2/2008 |
| JP | 5291282 | 9/2013 |
| KR | 100945748 | 3/2010 |
| KR | 10-2012-0135640 A | 12/2012 |
| KR | 10-2013-0039486 A | 4/2013 |

OTHER PUBLICATIONS

Sieco reference; https://www.siecoengineers.com/product3.php; See also https://web.archive.org/web/20121119105947/https://www.siecoengineers.com/product3.php (Year: 2012).*

* cited by examiner

[Fig. 1]
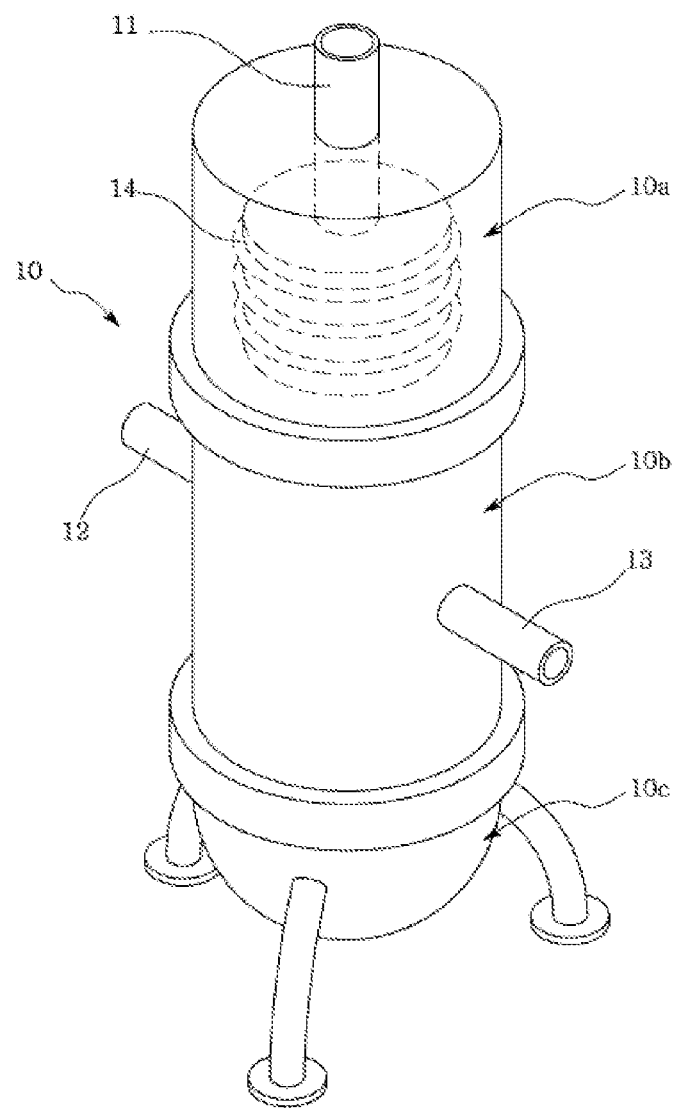

[Fig. 2]
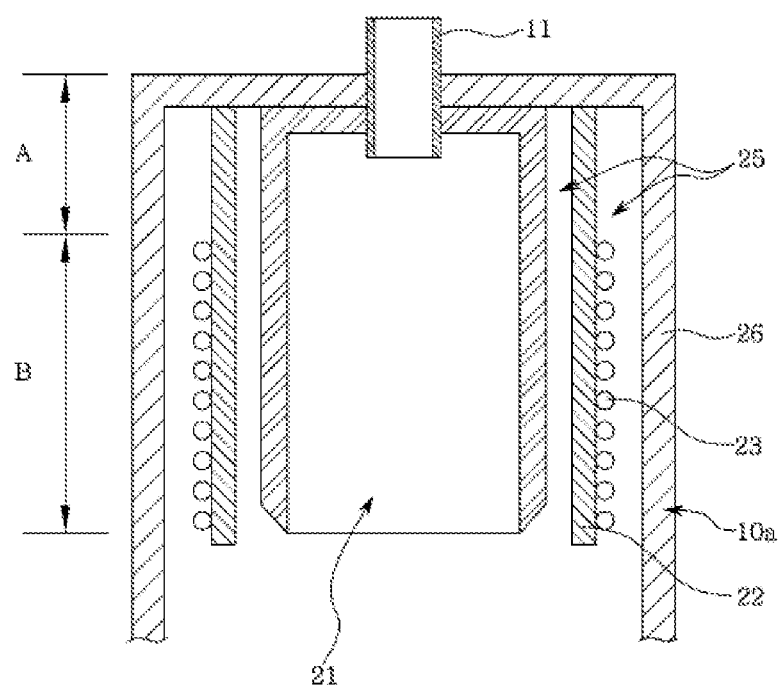

[Fig. 3]
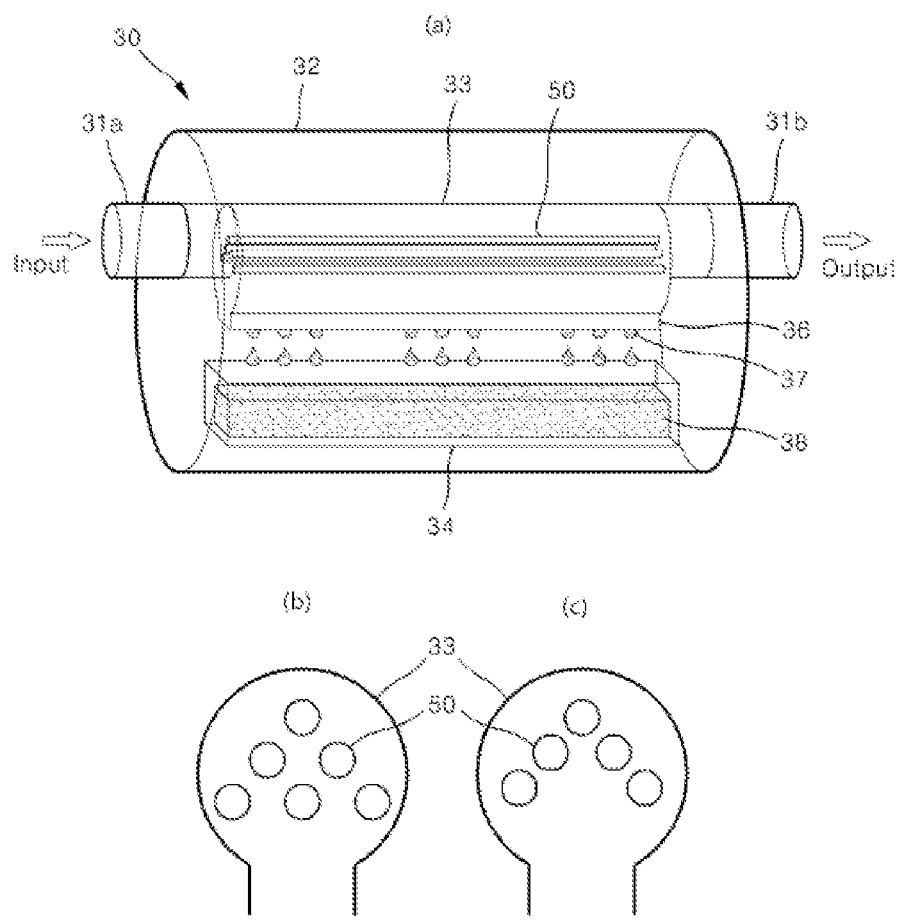

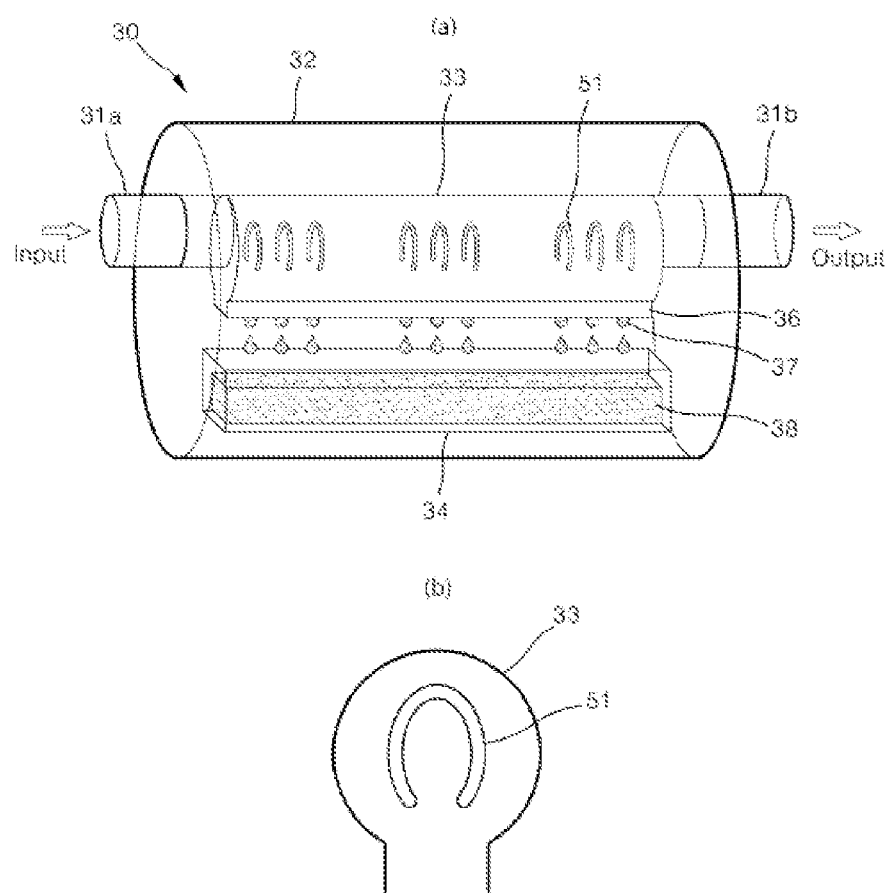
[Fig. 4]

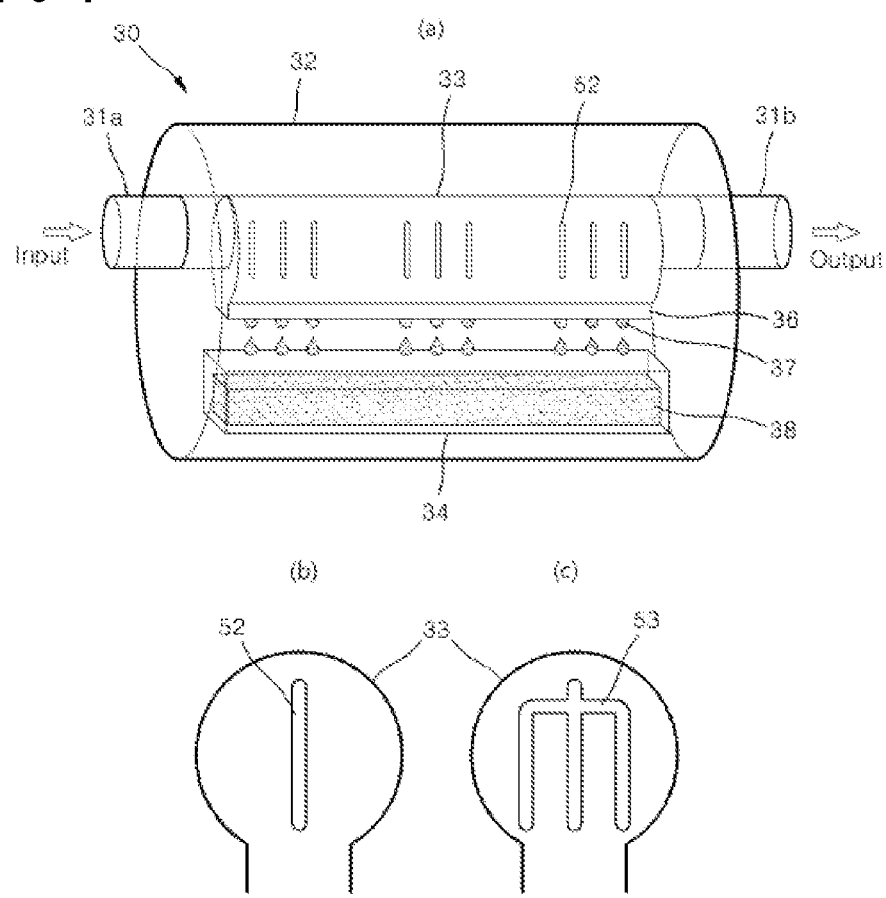
[Fig. 5]

[Fig. 6]
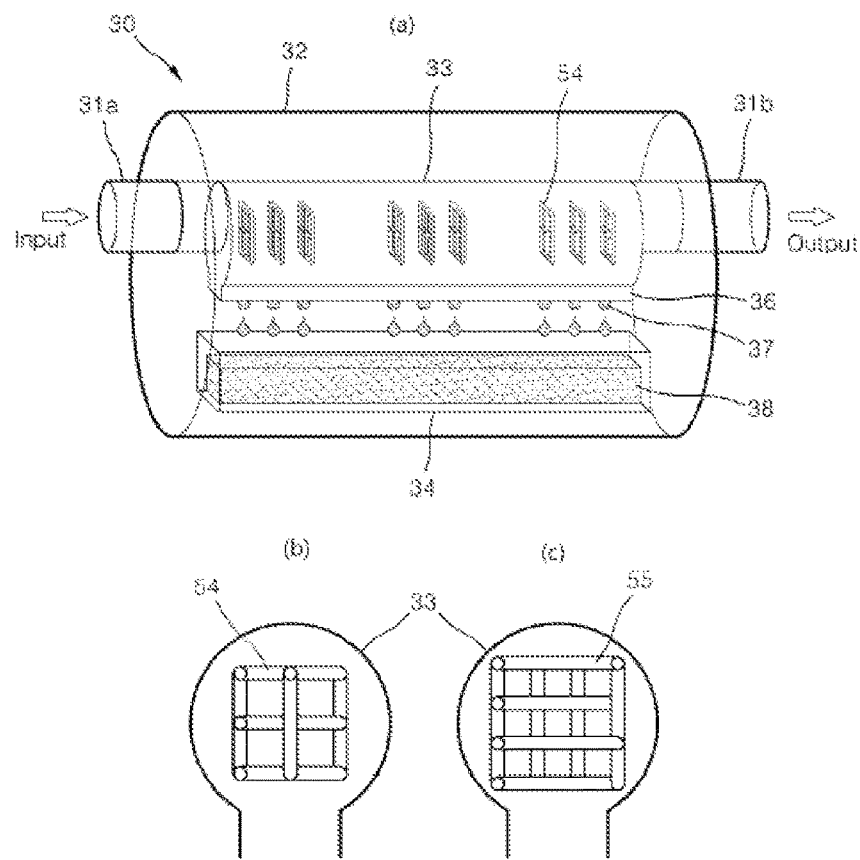
[Fig. 7]
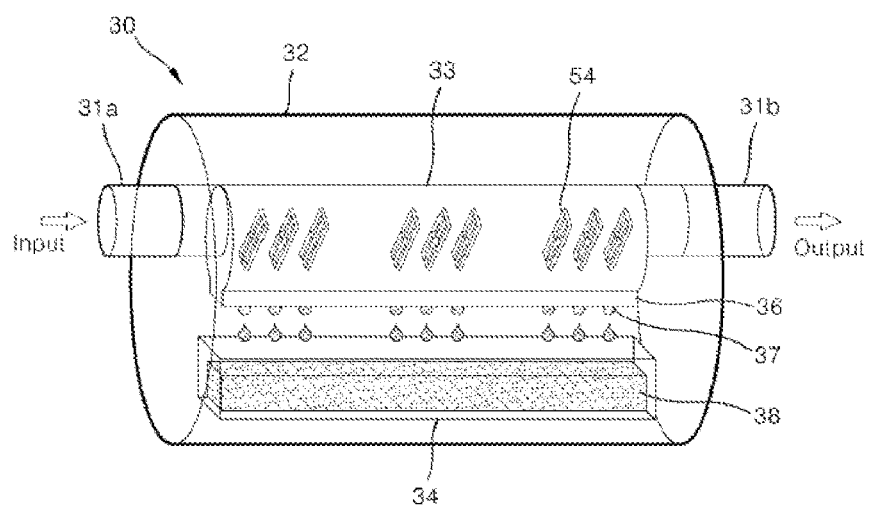

DEVICE FOR MANUFACTURING POLYSILICON USING HORIZONTAL REACTOR AND METHOD FOR MANUFACTURING SAME

This application is a National Stage Entry of International Application No. PCT/KR2015/004701 filed May 11, 2015, and claims priority to and the benefits of Korean Patent Application No. 10-2014-0057094 filed May 13, 2014, each of which is incorporated by reference for all purposes as if fully set forth herein.

BACKGROUND OF THE INVENTION

1. Field of the Invention

The present invention relates to a polysilicon production apparatus and method, and more specifically to an apparatus and method for the production of polysilicon using a horizontal reactor.

2. Description of the Related Art

In recent years, there has been a growing demand for polysilicon as a raw material in the fabrication of electronic devices, such as semiconductor devices and photovoltaic devices. Many methods are known for the production of silicon as a raw material in the fabrication of semiconductors or solar photovoltaic cells and some of them are have already been carried out industrially.

Currently commercially available high-purity polysilicon is typically produced by chemical vapor deposition processes. Specifically, polysilicon can be produced by reacting trichlorosilane gas with a reducing gas, such as hydrogen gas, as depicted in Reactions 1 and 2:

$$SiHCl_3 + H_2 \rightarrow Si + 3HCl \tag{1}$$

$$4SiHCl_3 \rightarrow Si + 3SiCl_4 + 2H_2 \tag{2}$$

The Siemens method is an exemplary commercially available polysilicon production method. According to the Siemens method, silane gases as reactant gases and hydrogen gas as a reducing gas are fed into a bell-jar reactor and a silicon rod placed in the bell-jar reactor is heated to or above the deposition temperature of silicon. When transferred to the reactant gases and the reducing gas, the heat reduces the reactant gases to deposit polysilicon.

However, the Siemens reactor consumes much energy, commonly an electrical energy of about 65 to about 200 KWh/kg. This electrical energy cost accounts for a very large portion of the total polysilicon production cost. Another problem is that the batch type deposition requires extremely laborious processes, including silicon rod installation, ohmic heating, deposition, cooling, extraction, and bell-jar reactor cleaning.

Another method is associated with the deposition of polysilicon using a fluidized bed. According to this method, a silane is supplied simultaneously with the supply of fine silicon particles having a size of about 100 microns as deposition nuclei to deposit silicon on the fine silicon particles, and as a result, silicon grains having a size of 1 to 2 mm are continuously produced. This method is advantageous in that continuous operation is possible for a relatively long time. However, due to its low deposition temperature, monosilane as a silicon source is thermally decomposed even at a low temperature, tending to form finely-divided silicon or deposit silicon on the reactor wall. Thus, regular cleaning or exchange of the reaction vessel is required.

An apparatus for producing polycrystalline silicon using a vertical reduction reactor is disclosed in Korean Patent No. 10-0692444. The apparatus uses a heater on which silicon is deposited. The heater is cylindrically shaped for high thermal efficiency. Specifically, the apparatus includes (a) a cylindrical vessel having an opening which is a silicon take-out port at the lower end, (b) a heater for heating the inner wall from the lower end to a desired height of the cylindrical vessel at a temperature equal to or higher than the melting point of silicon, (c) a chlorosilane feed pipe which is composed of an inner pipe having a smaller outer diameter than the inner diameter of the cylindrical vessel and constituted such that one opening of the inner pipe faces down in a space surrounded by the inner wall heated at a temperature equal to or higher than the melting point of silicon, and (d) a first seal gas feed pipe for supplying seal gas into a gap defined by the inner wall of the cylindrical vessel and the outer wall of the chlorosilane feed pipe. The apparatus optionally further includes (e) a hydrogen gas feed pipe for supplying hydrogen gas into the above cylindrical vessel.

FIG. 1 schematically illustrates a polysilicon production apparatus that is of a vertical reduction reactor type.

Referring to the figure, the polysilicon production apparatus includes a reactant gas inlet port 11 disposed on top of a reactor 10, a vacuum pipe 12 disposed at one side of a middle portion 10b of the reactor 10, and an outlet pipe 13 disposed at the other side of the reactor 10. Units for collecting, cooling, and casting molten silicon are disposed in a lower portion 10c of the reactor 10.

Silane gases as reactant gases are supplied through the inlet port 11. The silane gases may be monosilane, dichlorosilane, trichlorosilane (TCS) or tetrachlorosilane (STC). After operation of the reactor 10, the vacuum pipe 12 can be used to create a vacuum for cleaning and purging the internal space of the reactor and the outlet pipe 13 can be used to release waste gases generated during the reactions. An induction heating coil 14 is provided in an upper portion of the reactor 10. When an RF current is applied to the induction heating coil 14, an eddy current is generated in a reaction tube 21 to release heat. This heat is applied to the gases entering through the gas inlet port and the wall surface of the reaction tube 21 to induce the deposition of polysilicon.

FIG. 2 is a schematic cross-sectional view of the upper portion 10a of the reactor illustrated in FIG. 1.

Referring to the figure, the reaction tube 21 is provided in the upper portion 10a of the reactor and the reactant gases, such as silane gases, are supplied to the reaction tube 21 through the reactant gas supply port 11. A heating coil 23 is arranged on the surface of an insulating tube 22 provided outside the reaction tube 21. A sealing gas is supplied through a sealing gas supply pipe (not shown) and is filled between the reaction tube 21 and the insulating tube 22 and between the insulating tube 22 and an outer vessel 26. The sealing gas 25 serves to prevent the reactant gases from leaking through gaps between the reaction tube 21 and the insulating tube 22 and between the insulating tube 22 and the outer vessel 26. A reducing gas, such as hydrogen, is supplied through a reducing gas supply pipe (not shown). The reducing gas may be supplied in admixture with the silane gases.

As illustrated in the cross-sectional view of FIG. 2, the heating coil 23 is not wound in an upper region "A" of the reaction tube 21 but is wound in a lower region "B" of the reaction tube 21. This structure ensures thermal stability and substantially isothermal distribution of the reaction tube. The region "B" is required to have a length 3 to 4 times larger than the diameter of the reaction tube.

Thus, heat transferred from the heating coil 23 to the reaction tube 21 is concentrated on the lower region "B" rather than on the upper region "A". However, the polysilicon production apparatus illustrated in FIGS. 1 and 2 has the problem that large amounts of the reactant gases and the reducing gas entering the reaction tube 21 pass through the reaction tube without coming into contact with the wall surface of the reaction tube 21, and as a result, sufficient deposition does not take place at high temperature.

That is, since heat is not sufficiently transferred to the gases flowing through the central portion of the reaction tube 21 farthest away from the heating coil 23, slow reduction reactions take place, leading to low overall production efficiency and energy efficiency.

SUMMARY OF THE INVENTION

One object of the present invention is to provide an improved polysilicon production apparatus and method that are free from the problems of the prior art.

A further object of the present invention is to provide an apparatus and method for producing polysilicon with high efficiency.

According to one aspect of the present invention, there is provided a polysilicon production apparatus including: a horizontal reaction tube positioned in an insulated tube and having an inlet port through which gaseous raw materials including silicon-containing reactant gases and a reducing gas are supplied, an outlet port through which residual gases exit, a reaction surface with which the gaseous raw materials come into contact, and a plurality of bottom openings through which molten polysilicon produced by the reactions of the gaseous raw materials is discharged; one or more internal structures placed in the horizontal reaction tube to provide additional reaction surfaces; and first heating means adapted to heat the reaction surface of the horizontal reaction tube.

According to one embodiment of the present invention, the apparatus may include second heating means adapted to heat the internal structures placed in the horizontal reaction tube.

According to one embodiment of the present invention, the apparatus may further include a container adapted to collect the molten polysilicon discharged through the bottom openings of the horizontal reaction tube.

According to a preferred embodiment of the present invention, the polysilicon collection container may further include third heating means adapted to maintain the collected polysilicon in a molten state or may maintain the collected polysilicon in a solid state without the need for additional heating means.

The reaction surface may include either the inner or outer surface of the horizontal reaction tube or both.

According to a preferred embodiment of the present invention, the bottom openings may be formed in a reaction region where the first heating means is provided.

According to a preferred embodiment of the present invention, the polysilicon may be discharged in the form of droplets through the bottom openings and may be collected in the collection container.

The horizontal reaction tube may be placed parallel to or inclined at an angle relative to the horizontal plane.

The reactant gases may include one or more of monosilane, dichlorosilane, trichlorosilane (TCS), and tetrachlorosilane (STC) and the reducing gas may include hydrogen.

According to a further aspect of the present invention, there is provided a polysilicon production method including: feeding gaseous raw materials including reactant gases and a reducing gas into a horizontal reaction tube, which is positioned in an insulated tube and includes one or more internal structures, through a gas supply port; heating the inner surface of the horizontal reaction tube as a reaction surface to the reaction temperature of the gaseous raw materials to deposit polysilicon; and discharging the deposited polysilicon in the form of droplets through a plurality of openings formed at the bottom of the horizontal reaction tube.

The method may further include heating the internal structures placed in the horizontal reaction tube.

The method may include independently controlling the temperatures of the internal structures placed in the horizontal reaction tube.

The method may further include collecting the discharged polysilicon in the form of droplets in a collection container.

The method may further include heating the collection container to maintain the collected polysilicon in a liquid state or maintaining the polysilicon collected in the collection container in a solid state.

As described above, the polysilicon production apparatus and method of the present invention use a horizontal reaction tube, unlike conventional apparatuses and methods using vertical reactors. The use of the horizontal reaction tube increases the contact area of a reaction surface for the reactions of gaseous raw materials, leading to an increase in silicon conversion and facilitating control over the temperature of the reaction surface. According to the present invention, molten silicon can be collected and supplied to a downstream process. This can reduce the quantity of energy necessary for silicon remelting and can contribute to energy saving by thermal supplement between the overlying horizontal reaction tube and an underlying collection container. In addition, a plurality of reaction regions, in each of which temperature, gaseous raw materials, and by-products can be independently controlled, are set, contributing to an enhancement of polysilicon deposition efficiency.

BRIEF DESCRIPTION OF THE DRAWINGS

FIG. 1 is a schematic perspective view of a polysilicon production apparatus according to the prior art.

FIG. 2 is a cross-sectional view schematically illustrating an upper portion of the reactor illustrated in FIG. 1.

FIGS. 3 to 7 are schematic views illustrating the constructions of polysilicon production apparatuses according to exemplary embodiments of the present invention.

DETAILED DESCRIPTION OF THE INVENTION

The present invention will now be described in more detail with reference to embodiments illustrated in the accompanying drawings. However, this is not intended to limit the present invention to particular modes of practice, and it is to be appreciated that all changes, equivalents, and substitutes that do not depart from the spirit and scope of the present invention are encompassed in the present invention.

Like reference numerals refer to the like elements throughout the drawings.

Although the terms "first", "second", "A", "B", etc. may be used to describe various elements, such elements must not be limited to the above terms. The above terms are used only to distinguish one element from another.

The term "and/or" includes any and all combinations of one or more of the associated listed items.

It will be understood that when an element is referred to as being "connected" or "coupled" to another element, it can be directly connected or coupled to the another element or intervening elements may be present.

As used herein, an expression used in the singular encompasses the expression of the plural, unless the context clearly indicates otherwise.

The terms "comprises", "comprising", "includes", "including", "has", "having", etc. are intended to indicate the existence of features, numbers, steps, operations, elements, components or combinations thereof disclosed in the specification, and are not intended to preclude the possibility that one or more other features, numbers, steps, operations, elements, components or combinations thereof may exist or may be added.

According to the present invention, there is provided a polysilicon production apparatus including: a horizontal reaction tube positioned in an insulated tube and having an inlet port through which gaseous raw materials including silicon-containing reactant gases and a reducing gas are supplied, an outlet port through which residual gases exit, a reaction surface with which the gaseous raw materials come into contact, and a plurality of bottom openings through which molten polysilicon produced by the reactions of the gaseous raw materials is discharged; one or more internal structures placed in the horizontal reaction tube to provide additional reaction surfaces; and first heating means adapted to heat the reaction surface of the horizontal reaction tube.

The use of the horizontal reaction tube in the polysilicon production apparatus is advantageous over the use of a vertical reaction apparatus in that the reaction conditions, such as the temperatures and pressures of the reactant gases and the reducing gas, are easy to control.

The present invention will be more specifically explained with reference to the accompanying drawings.

FIG. 3 is a schematic view illustrating the construction of a polysilicon production apparatus according to one embodiment of the present invention.

Referring to the figure, the polysilicon production apparatus 30 includes a horizontal reaction tube 33 positioned in an insulated tube 32 and having an inlet port 31a through which gaseous raw materials including reactant gases and a reducing gas are supplied, an outlet port 31b through which residual gases exit, a reaction surface with which the gaseous raw materials come into contact, and a plurality of bottom openings 36 through which molten polysilicon produced by the reactions of the gaseous raw materials is discharged; one or more internal structures 50 placed in the horizontal reaction tube to provide additional reaction surfaces; first heating means (not shown) adapted to heat the reaction surface of the horizontal reaction tube 30; and a container 34 adapted to collect the molten polysilicon 37 discharged through the bottom openings 36.

The polysilicon collection container 34 illustrated in FIG. 3 is not necessary and may be removed. The reactant gases may include one or more of monosilane, dichlorosilane, trichlorosilane (TCS), and tetrachlorosilane (STC) and the reducing gas may include hydrogen.

As illustrated in FIG. 3, both the horizontal reaction tube 33 and the polysilicon collection container 34 are arranged in the insulated tube 32. This arrangement is preferred in that heat transfer with the outside can be blocked to prevent energy loss and heat can be supplemented by thermal interference between the horizontal reaction tube 33 and the polysilicon collection container 34 to achieve energy saving.

In the apparatus of the present invention, the bottom openings 36 are formed in the horizontal reaction tube 33. Due to this structure, the reaction surface of the gaseous raw materials may be either the inner or outer surface of the horizontal reaction tube 33 or both. When the reaction surface is heated to near the melting temperature of polysilicon, silicon is produced by the reactions of the silicon-containing reactant gases with the reducing gas and may flow down in a molten state along the reaction surface. The horizontal reaction tube 33 is circular in cross section but is not limited thereto. For example, the horizontal reaction tube 33 may have a triangular or inverted U-shaped cross-section which has an open bottom and along which the deposited silicon can flow down.

In addition to the reaction surface as the inner surface of the horizontal reaction tube 33, the internal structures 50 placed in the horizontal reaction tube 33 provide additional reaction surfaces, achieving enhanced reaction efficiency. The internal structures 50 need to be heated to a temperature suitable for silicon deposition to provide additional reaction surfaces. The internal structures 50 may be directly heated. For direct heating, the internal structures 50 are connected to external second external heating means (not shown). Alternatively, the internal structures 50 may be indirectly heated by heat transfer from the horizontal reaction tube heated by the first heating means.

As described above, the polysilicon collection container 34 is adapted to collect the molten silicon discharged through the bottom openings 36 of the horizontal reaction tube 33. The collected polysilicon 38 may also be maintained in a solid state in the polysilicon collection container 34 but it is more preferred that the polysilicon collection container 34 further includes third heating means (not shown) to maintain the collected polysilicon 38 in a molten state.

FIG. 3 illustrates a structure according to one embodiment of the present invention in which the internal structures 50 in the form of rods are placed in a horizontal direction parallel to the reaction tube. Specifically, (b) and (c) of FIG. 3 are different cross-sectional views of the horizontal reaction tube illustrated in (a) of FIG. 3. The internal structures may be arranged in various configurations. The number of the internal structures is not limited and it would, of course, be possible to place only one rod in the horizontal reaction tube 33.

The molten silicon flowing down along the reaction surfaces of the internal structures 50 and the horizontal reaction tube 33 may be discharged in the form of droplets 37 through the bottom openings 36 of the horizontal reaction tube 33 and may be collected in the collection container 34.

The openings 36 are formed in a reaction region where the first heating means adapted to heat the reaction surface of the horizontal reaction tube 33 is provided. This arrangement is preferred for discharge of the molten silicon in the form of droplets.

Although not illustrated in the figure, the horizontal reaction tube 33 is placed parallel to the horizontal plane. Alternatively, the horizontal reaction tube 33 may be inclined at an angle relative to the horizontal plane such that the molten silicon remaining on the horizontal reaction tube flows down along the reaction surface and is easily discharged through the openings 36.

The polysilicon production apparatus using the horizontal reaction tube is advantageous over vertical reaction apparatuses in that the reaction conditions, such as the temperatures and pressures of the reactant gases and the reducing gas, are easy to control.

FIGS. 4 to 7 illustrates the shapes of internal structures according to exemplary embodiments of the present invention. The internal structures are not limited to circular rods in shape and may have various shapes, for example, angular rods, U-shaped rods, and mesh rods. The internal structures may be arranged in various directions, including in horizontal, vertical, and inclined directions. The internal structures are not limited to particular shapes so long as they do not interfere with the dropping of the molten silicon.

Specifically, FIG. 4 illustrates U-shaped internal structures 51 placed in the horizontal reaction tube 33.

FIG. 5 illustrates short bar-shaped internal structures 52 or fork-shaped internal structures 53 vertically placed in the horizontal reaction tube 33.

FIG. 6 illustrates mesh internal structures 54 and 55 vertically placed in the horizontal reaction tube 33.

In the case where the plurality of internal structures are placed, as illustrated in FIGS. 4 to 6, the temperatures of the reaction regions can be controlled independently by controlling the temperature of heating means connected to the outside.

For example, the reaction conditions can be controlled depending on the amount of by-products produced as the reactions of the silicon-containing reactant gases and the reducing gas proceed. Specifically, the following reactions may proceed in Regions 1 and 2:

$$TCS+H_2 \rightarrow Si(s)+TCS+STC+HCl \qquad \text{Region 1:}$$

$$TCS+STC+HCl+H_2 \rightarrow Si(s)+STC+HCl \qquad \text{Region 2:}$$

The internal structures control the reaction in Region 1 to conditions advantageous for the conversion of TCS to Si(s) and the reaction in Region 2 to conditions advantageous for the conversion of STC to Si(s), resulting in an increase in the overall silicon deposition efficiency.

As another method, appropriate amounts of gaseous raw materials, i.e. silicon-containing reactant gases, a reducing gas or a combination thereof, necessary for the reactions may be further supplied to the respective reaction regions to promote the deposition of silicon. To this end, inlet ports for the supply of the gaseous raw materials may be formed in one or more of the reaction regions, although not illustrated in the figures.

The internal structures illustrated in FIGS. 4 to 6 are vertically arranged in the respective horizontal reaction tubes but are not limited to this arrangement. The internal structures may be slightly inclined or horizontally arranged, as illustrated in FIG. 7. Any arrangement is possible that does not hinder the vertical dropping of molten silicon.

Another aspect of the present invention provides a method for producing polysilicon using the apparatus.

Specifically, the method includes: feeding gaseous raw materials including reactant gases and a reducing gas into a horizontal reaction tube, which is placed in an insulated tube and includes one or more internal structures, through a gas supply port; heating the inner surface of the horizontal reaction tube as a reaction surface to the reaction temperature of the gaseous raw materials to deposit polysilicon; and discharging the deposited polysilicon in the form of droplets through a plurality of openings formed at the bottom of the horizontal reaction tube.

The method may further include heating the internal structures placed in the horizontal reaction tube. Alternatively, the internal structures may be indirectly heated by heat transfer from the heated horizontal reaction tube.

The method may further include collecting the discharged polysilicon in the form of droplets in a collection container.

The polysilicon collected in the collection container may be maintained in a solid state or may be melted by heating the collection container.

The horizontal reaction tube may form a single reaction region. Alternatively, the horizontal reaction tube may include a plurality of reaction regions whose temperatures are controllable independently. In this case, high silicon conversion can be achieved.

The method may include further supplying reactant gases, a reducing gas or a mixture thereof to one or more of the reaction regions. This step ensures maximum silicon deposition efficiency.

The gaseous raw materials used in the method of the present invention may include silicon-containing reactant gases. For example, the silicon-containing reactant gases may include one or more silicon gases selected from monosilane, dichlorosilane, trichlorosilane (TCS), and tetrachlorosilane. The reducing gas typically includes hydrogen. As another example, the reducing gas may include Zn or Na. However, there is no particular restriction on the kind of the reducing gas. The polysilicon production method using the apparatus of the present invention may be carried out at a temperature for polysilicon melting. The polysilicon production method is carried out in the temperature range of 1400 to 1800° C., more preferably 1400 to 1600° C. Within this range, molten silicon maintains its viscosity such that it easily moves to and drops from the bottom of the reaction tube. The method may be carried out at a pressure of 1 to 5 atm.

For example, induction heating or resistance heating may be used as a heating source to heat the reaction tube to or above the melting temperature of silicon. Taking into consideration the structure of the reactor, it is preferred to directly heat the reaction tube by resistance heating. However, the heating mode is not particularly limited and induction heating is also possible. Specifically, the reaction tube (i.e. the reaction surface) and the underlying collection container can be heated individually by resistance heating. For induction heating, the form of an induction coil should be taken into consideration. In this case, the reaction tube and the underlying collection container are positioned in a single coil such that their temperatures can be controlled by the single coil.

No particular limitation is imposed on the materials for the reaction tube, the internal structures, the collection container, and the other elements of the apparatus according to the present invention. It is preferred to manufacture the reaction tube, the internal structures, and the collection container using materials that are less reactive with the gaseous raw materials or molten polysilicon. Examples of such materials include carbon materials, such as graphite, glassy carbon, and polycarbonates, silicon carbide (SiC), silicon nitride ($Si_3N_4$), boron nitride (BN), SiC-coated graphite, molybdenum (Mo), tantalum (Ta), and quartz.

For example, the use of graphite may increase the risk of penetration of carbon (i.e. carburizing) into molten silicon, leading to low silicon purity. However, as the reactions proceed, the molten silicon reacts with the graphite on the surface of the reactor to form a SiC layer, which serves to prevent the carbon from penetrating into the silicon. Alternatively, a SiC layer-coated graphite vessel may be used or a quartz crucible may be introduced into the graphite vessel. In this case, impurities can be blocked from entering the silicon, which can maintain the silicon at high purity.

The polysilicon production apparatus of the present invention facilitates the production of molten polysilicon in high purity. Thus, the molten silicon can be fed into a mold (not shown) in a casting region disposed downstream of the apparatus and cooled to obtain a lump of cast polysilicon. Alternatively, the polysilicon may be stored in a liquid state before use in a subsequent process.

After the reactions, waste gases can be recovered. The recovered waste gases can be separated and converted to reactant gases in separate processes. The obtained reactant gases can be recycled for silicon deposition.

The present invention employs a horizontal reaction tube instead of a bell-jar reactor. The use of the horizontal reaction tube facilitates control over the reaction area and the retention time of gaseous raw materials in the reactor, leading to the production of polysilicon with high efficiency.

The opening portions for silicon recovery underlying the reaction tube have a larger heat sink area and a smaller heat radiation area and are more difficult to be thermally supplemented from the surroundings than the other portions of the reaction tube, increasing the risk that the silicon tends to coagulate with dropping temperature. That is, even when the temperature of the central portion of the reaction tube (i.e. the reaction surface) is equal to or higher than the melting temperature of silicon, the bottom temperature of the reaction surface drops to a temperature equal to or lower than the melting temperature of silicon. As a result, the molten silicon does not drop to the underlying container and coagulates in the reaction tube. This phenomenon may be continued to clog the bottom of the reaction surface.

When it is intended to maintain the bottom openings of a bell-jar reactor at a temperature equal to or higher than the melting temperature of silicon, the middle portion of the reactor is kept at a relatively high temperature, resulting in a large temperature difference (i.e. gradient). In a conventional silicon deposition method using silane gases, there is a risk that silicon dust may be produced by nucleation at high temperature. The silicon dust decreases the silicon deposition efficiency and may cause problems in a downstream process (i.e. waste gas recycling process). Further, the conventional method has difficulty in controlling the reactor temperature. In a general method for silicon production by CVD or VLD (including LLC), silicon deposited on the reaction surface by surface reactions of a reaction tube can be finally collected in a molten state in an underlying collection container. However, dust may be formed by silicon nucleation in a space of a specific high-temperature region in the reactor. The dust may not be adsorbed to the surface of the reaction tube and may be entrained in a gas flow and discharged with waste gases from the reaction tube. The discharge of the dust without recovery leads to low silicon production efficiency. The discharged silicon dust together with waste gases may cause problems in downstream processing units, such as exhaust gas lines.

When compared to a bell-jar reactor, the horizontal reaction tube used in the present invention has a small temperature gradient across the height thereof due to its short length in the vertical direction, making it easy to maintain the internal temperature of the reaction tube at a constant level. Due to this temperature control, enhanced conversion of gaseous raw materials to silicon can be expected.

The silicon collection container is positioned near the bottom of the reactor and silicon can be maintained in a liquid state in the collection container. This thermal supplement effect contributes to energy saving.

After the gaseous raw materials are charged into the reaction tube, conversion of the gaseous raw materials to silicon is substantially completed at the entrance of the reaction tube. In contrast, a bell-jar reactor requires a large quantity of energy to maintain silicon in a liquid state until silicon produced in the upper portion of a reaction tube flows down along the reaction surface, drops to the bottom of the reaction tube, and is collected in a collection container.

Although the silicon conversion is substantially completed in the front portion of the horizontal reactor immediately after charge, the formed liquid silicon should fall down a distance for recovery. This distance is shorter in the horizontal reactor than in the bell-jar reactor, causing less thermal loss (i.e. energy loss). According, the horizontal reactor is advantageous in energy efficiency.

Furthermore, the internal structures capable of providing additional reaction areas to the horizontal reaction tube are mounted in the apparatus of the present invention such that the contact area with the gaseous raw materials is increased, contributing to further enhancement of silicon conversion.

While the present invention has been described with reference to the embodiments illustrated in the accompanying drawings, it will be understood by those skilled in the art that the embodiments are merely illustrative and various modifications and equivalents can be made to these embodiments. Therefore, the true scope of the present invention should be defined by the appended claims.

As is apparent from the above description, the polysilicon production apparatus and method of the present invention use a horizontal reaction tube, unlike conventional apparatuses and methods using vertical reactors. The use of the horizontal reaction tube increases the contact area of a reaction surface for the reactions of gaseous raw materials, leading to an increase in silicon conversion and facilitating control over the temperature of the reaction surface. According to the present invention, molten silicon can be collected and supplied to a downstream process. This can reduce the quantity of energy necessary for silicon remelting and can contribute to energy saving by thermal supplement between the overlying horizontal reaction tube and an underlying collection container. In addition, a plurality of reaction regions, in each of which temperature, gaseous raw materials, and by-products can be independently controlled, are set, contributing to an enhancement of polysilicon deposition efficiency.

What is claimed is:
1. A polysilicon production apparatus comprising:
   an insulated tube;
   a horizontal reaction tube positioned in the insulated tube, the horizontal reaction tube comprising:
      an inlet port through which gaseous raw materials comprising silicon-containing reactant gases and a reducing gas are supplied at one end of the horizontal reaction tube;
      an outlet port through which residual gases exit at the opposite end of the horizontal reaction tube;
      a reaction surface with which the gaseous raw materials come into contact, and
      a plurality of bottom openings through which molten polysilicon produced by the reactions of the gaseous raw materials is discharged out of the horizontal reaction tube;
   one or more internal structures placed within the horizontal reaction tube and arranged in a horizontal, a vertical, or an inclined direction within the reaction tube to provide additional reaction surfaces;
   a first heater adapted to heat the reaction surface of the horizontal reaction tube; and
   a collection container adapted to collect the molten polysilicon discharged through the bottom openings of the horizontal reaction tube.

2. The polysilicon production apparatus according to claim 1, further comprising a second heater adapted to heat the internal structures placed within the horizontal reaction tube.

3. The polysilicon production apparatus according to claim 1, wherein the polysilicon collection container further comprises a third heater adapted to maintain the collected polysilicon in a molten state.

4. The polysilicon production apparatus according to claim 1, wherein the reaction surface is either an inner surface or an outer surface of the horizontal reaction tube or both.

5. The polysilicon production apparatus according to claim 1, wherein the bottom openings of the horizontal reaction tube are formed in a reaction region where the first heater is provided.

6. The polysilicon production apparatus according to claim 1, wherein the polysilicon is discharged in the form of droplets through the bottom openings of the horizontal reaction tube and is collected in the collection container.

7. The polysilicon production apparatus according to claim 1, wherein the reactant gases comprise one or more of monosilane, dichlorosilane, trichlorosilane (TCS), and tetrachlorosilane (STC) and the reducing gas comprises hydrogen.

8. The polysilicon production apparatus according to claim 1, wherein the internal structures placed within the horizontal reaction tube have a shape selected from among circular rod, angular rod, U-shaped, mesh, and forked-shaped.

9. The polysilicon production apparatus of claim 1, wherein the first heater is an induction heater or a resistance heater.

10. The polysilicon production apparatus of claim 2, wherein the second heater is an induction heater or a resistance heater.

11. A polysilicon production method comprising:
   feeding through a gas supply port gaseous raw materials comprising reactant gases and a reducing gas into a horizontal reaction tube, which is positioned in an insulated tube, where the horizontal reaction tube comprises one or more internal structures placed within the horizontal reaction tube, the internal structures arranged in a horizontal, a vertical, or an inclined direction within the reaction tube to provide additional reaction surfaces, and the horizontal reaction tube comprises a plurality of openings formed at the bottom of the horizontal reaction tube;
   heating an inner surface of the horizontal reaction tube as a reaction surface to a reaction temperature of the gaseous raw materials to deposit polysilicon;
   discharging the deposited polysilicon in the form of droplets through the plurality of openings at the bottom of the horizontal reaction tube; and
   collecting the discharged polysilicon in the form of droplets in a collection container.

12. The polysilicon production method according to claim 11, further comprising heating the internal structures placed within the horizontal reaction tube to a reaction temperature of the gaseous raw materials.

13. The polysilicon production method according to claim 11, further comprising heating the collection container to maintain the collected polysilicon in a liquid state or maintaining the polysilicon collected in the collection container in a solid state.

14. The polysilicon production method according to claim 11, wherein the method comprises independently controlling the temperatures of the internal structures placed within the horizontal reaction tube.

15. The polysilicon production method according to claim 11, wherein the reactant gases comprise one or more of monosilane, dichlorosilane, trichlorosilane (TCS), and tetrachlorosilane (STC) and the reducing gas comprises hydrogen.

16. The polysilicon production method according to claim 11, wherein the internal structures placed within the horizontal reaction tube have a shape selected from among circular rod, angular rod, U-shaped, mesh, and forked-shaped.

* * * * *